United States Patent
Lopatinsky et al.

(10) Patent No.: US 6,698,505 B2
(45) Date of Patent: Mar. 2, 2004

(54) COOLER FOR AN ELECTRONIC DEVICE

(75) Inventors: Edward Lopatinsky, San Diego, CA (US); Daniel Schaefer, Palm Desert, CA (US); Saveliy Rosenfeld, San Diego, CA (US); Lev Fedoseyev, El Cajon, CA (US)

(73) Assignee: Rotys Inc., San Diego, CA (US)

( * ) Notice: Subject to any disclaimer, the term of this patent is extended or adjusted under 35 U.S.C. 154(b) by 0 days.

(21) Appl. No.: 10/303,609

(22) Filed: Nov. 25, 2002

(65) Prior Publication Data

US 2003/0137047 A1 Jul. 24, 2003

Related U.S. Application Data

(60) Provisional application No. 60/350,796, filed on Jan. 22, 2002.

(51) Int. Cl.[7] ................................................. F28F 13/12
(52) U.S. Cl. ...................... 165/122; 165/80.3; 361/697; 361/704; 257/722; 174/16.3
(58) Field of Search ............................... 165/185, 80.3, 165/122; 361/697, 704; 257/722; 174/16.3

(56) References Cited

U.S. PATENT DOCUMENTS

| | | | | | |
|---|---|---|---|---|---|
| 5,860,472 | A | * | 1/1999 | Batchelder | 165/185 |
| 6,244,331 | B1 | * | 6/2001 | Budelman | 165/80.3 |
| 6,457,955 | B1 | * | 10/2002 | Cheng | 417/423.8 |
| 6,575,231 | B1 | * | 6/2003 | Wu | 165/121 |
| 2002/0079086 | A1 | * | 6/2002 | Huang et al. | 165/80.3 |

* cited by examiner

Primary Examiner—Terrell L McKinnon

(57) ABSTRACT

A cooler for an electronic device of the present invention is provided with a heatsink and a cross flow blower with an electric motor. The heatsink comprises a base and heat exchanging means made as flat disks, fins or flat plates. The base provides thermal contact with the electronic device and the heat exchanging means. The cross flow blower comprises a drum type impeller with an axis of rotation substantially normal to the base. The flat disks substantially perpendicular to the axis of rotation and located inside of the drum type impeller. The fins or flat plates substantially perpendicular to the axis of rotation and located outside of said drum type impeller. The heatsink further comprises heat-spreading means that provide thermal contact between the base and the flat disks and flat plates. The heat-spreading means may be heat-pipes.

10 Claims, 13 Drawing Sheets

COOLER FOR AN ELECTRONIC DEVICE

CROSS REFERENCE TO RELATED APPLICATIONS

The present application claims the benefit of priority of U.S. Provisional Patent Application serial No. 60/350,796, filed Jan. 22, 2002 for Edward Lopatinsky at al. the entire content of which is incorporated herein by reference.

FIELD OF THE INVENTION

The present invention relates generally to cooling systems. More particularly, the present invention relates to cooling systems for regulating the temperature of electronic components. The present invention is particularly, but not exclusively, useful for a cooling system for regulating the temperature of electronic components of a desktop computer.

BACKGROUND OF THE INVENTION

During normal operation, most electronic devices generate significant amounts of heat. If this heat is not continuously removed, the electronic device may overheat, resulting in damage to the device and/or a reduction in operating performance.

In order to avoid such problems caused by overheating, cooling devices are often used in conjunction with electronic devices.

One such cooling device used in conjunction with electronic devices is a heatsink. In such device, a heatsink is formed from a material, which readily conducts heat. The heatsink is usually placed on top of, and in physical contact with, the electronic device.

One method of increasing the cooling capacity of these heatsinks is by including a plurality of cooling fins that are physically connected to the heatsink. These fins serve to increase the surface area of the heatsink and, thus, maximize the transfer of heat from the heatsink to the ambient air. In this manner, the heatsink draws heat away from the electronic device and transfers the heat to the ambient air.

In order to further enhance the cooling capacity of a heatsink device, an electrically powered blower (an axial fan may serve as the blower) is often mounted within or on top of the heatsink. In operation, the blower forces air to pass over the fins of the heatsink, thus, cooling the fins by enhancing the heat transfer from the fins into the ambient air. As the fins are cooled, heat can be drawn from the electronic device and into the heatsink at a faster rate. The blower typically draws air into the heatsink from the top of the heatsink, passes the air over the fins, and exhausts the air from the heatsink in the vicinity of the bottom of the heatsink. Accordingly, the exhaust air is hotter than the intake air.

There are known devices of this type—see, for example, U.S. Pat. No. 6,152,214 "Cooling device and method". The design of the device comprises an axial fan that produces a flow passing by heat exchanging channels of the heatsink. However, due to the weak airflow in the area adjacent to the axial fan axle, the conditions for cooling of the central part of the heatsink located underneath a hub of the axial fan are unfavorable. In this case non-uniform cooling of the heatsink and electronic device, for example, processor, will take place. Besides, the energy of airflow outgoing from the axial fan impeller in the axial direction is expended because of deceleration and turn in motion before this airflow enters to the heat exchanging channels. This fact decreases the speed of airflow passing by the heat exchanging channels, which, in its turn, doesn't allow obtaining good conditions for the heat exchange process.

Centrifugal fans are used rarely in the cooling device designs for the purpose of producing airflow.

Specifically, U.S. Pat. No. 5,838,066 "Miniaturized cooling fan type heatsink for a semiconductor device" offers a design employing a centrifugal fan that is installed to the side of the heatsink. In one particular embodiment of this invention the cooling airflow passes by rectilinear heat exchanging channels of the heatsink.

However, placement of centrifugal blower to the side of the heatsink increases device size. This is so because the location of centrifugal blower leads to insufficient coordination between the direction of channel inlets and direction of airflow supplied from the blower. The loss in airflow energy results in the reduction of airflow motion speed in heat exchanging channels and in the decline of heat exchange efficiency. A portion of energy is also expended on friction against the casing, in which the blower is enclosed.

Cross flow fans/blowers are used much more rarely in the cooling device designs for the purpose of producing airflow.

It is known cooling devices that uses cross flow fan (see U.S. Pat. No. 6,047,765 "Cross flow cooling device for semiconductor components"). According to this design air flow producing by cross flow fan where an axle of an impeller is perpendicular to fins of a heatsink.

Another cooling device uses cross flow fan (see U.S. Pat. No. 6,227,286 "Heat sink and information processor using heat sink", FIGS. 15A–15C and 40A–40C). According to this design an axle of an impeller is perpendicular to a heatsink body.

The use of a cross flow type blower allows for the suction and discharging of air at the sides of the cross flow fan. The airflow through cross flow fan is a plane-parallel flow with respect to a plane perpendicular to the cross flow fan axle. This provides uniform airflow through a heatsink. However, cross flow type blowers require more space, thereby reducing the space used for heat exchange decreasing efficiency of cooling device in total.

Thus, it would be generally desirable to provide an apparatus, which overcomes problems associated with cooler for electronic devices.

SUMMARY OF THE INVENTION

Accordingly, it is an object of the present invention to provide apparatus including a heatsink and a blower in a cooler for electronic devices, which is capable of significantly improving heat efficiency thereof.

In order to achieve this object, a cooler for electronic devices is provided with a heatsink and a cross flow blower with an electric motor. The heatsink comprises a base and heat exchanging means. The base provides thermal contact with the electronic device and the heat exchanging means. The cross flow blower comprises a drum type impeller with an axis of rotation substantially normal to the base. The heat exchanging means are located inside and may be further located outside of the drum type impeller. The heatsink further comprises heat-spreading means that provide thermal contact between the base and the heat exchanging means.

The heat exchanging means located inside of the drum type impeller are flat disks substantially perpendicular to the axis of rotation and thermally connected with the base by at least one heat-spreading means located inside of the drum type impeller. This at least one heat-spreading means may be made as heat-pipe. Further, this at least one heat-spreading means may be made as a guide vane.

The heat exchanging means located outside of the drum type impeller are, illustratively, fins substantially perpendicular to the base. According to second embodiment of the present invention, the heat exchanging means located outside of said drum type impeller are flat plates substantially perpendicular to the axis of rotation and thermally connected with the base by at least one heat-spreading means located also outside of said drum type impeller. This at least one heat-spreading means may be made as heat-pipe.

The foregoing and other objectives, features and advantages of the invention will be more readily understood upon consideration of the following detailed description of the invention, taken in conjunction with the accompanying drawings.

DETAILED DESCRIPTION OF PREFERRED EMBODIMENTS

Figure 1:
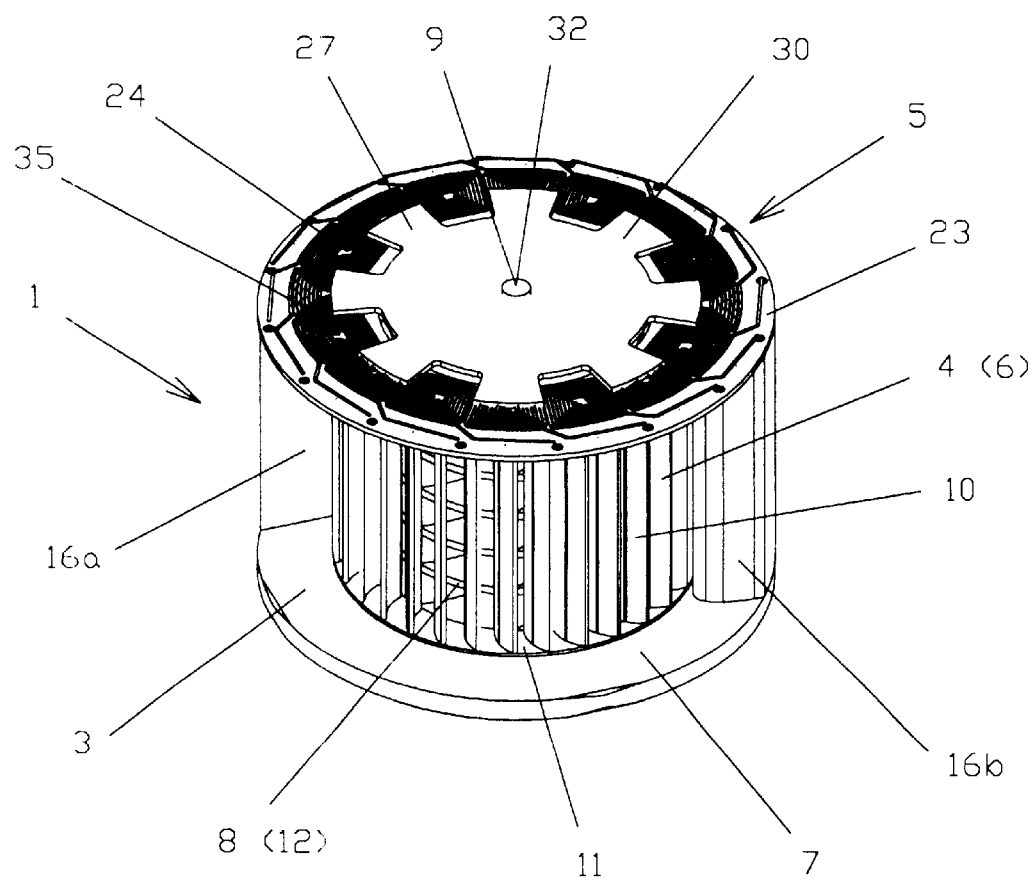
FIG. 1 is a perspective view showing the first embodiment of the present invention with a view at an upper electric motor part with a flat electric motor.
Figure 2:
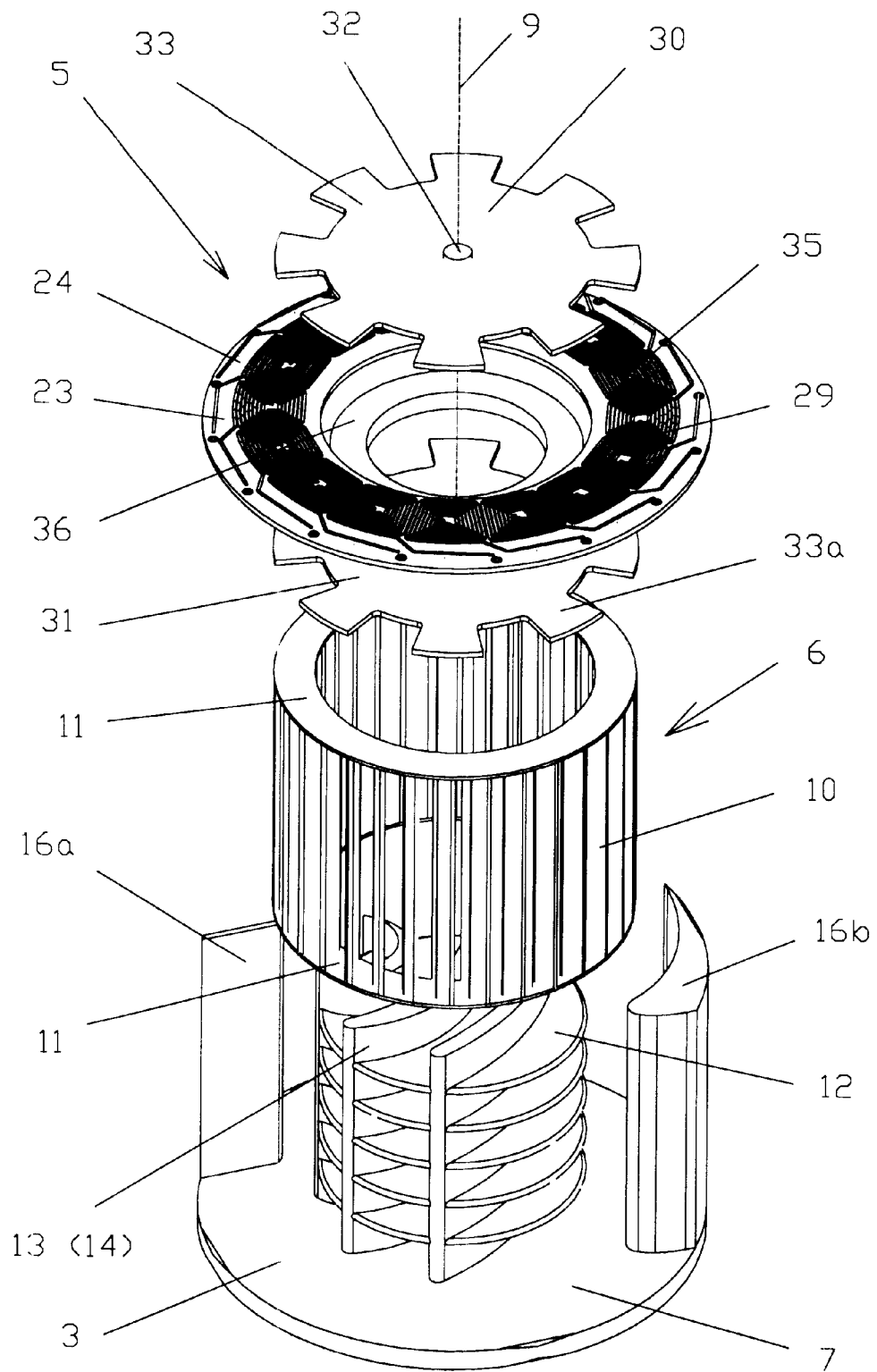
FIG. 2 is an exploded view showing the first embodiment of the present invention shown in FIG. 1.
Figure 3:
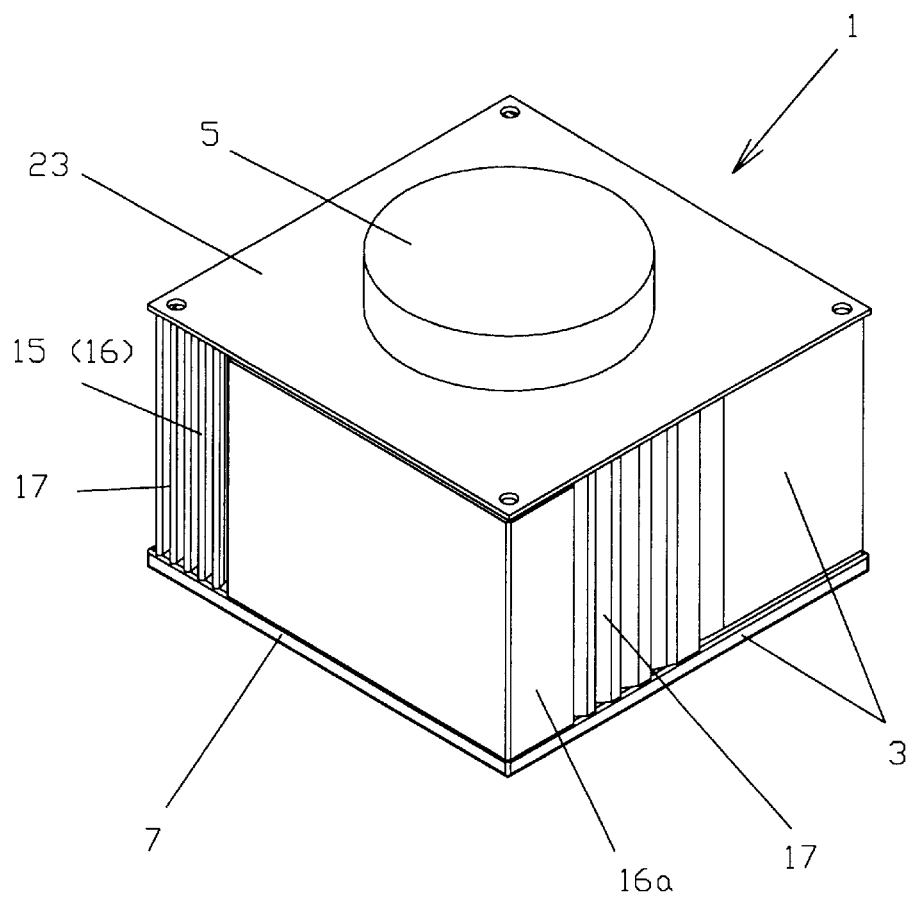
FIG. 3 is a perspective view showing the first embodiment of the present invention with heat exchanging means that further located outside of the drum type impeller with a view at an upper electric motor part with a conventional electric motor.
Figure 4:
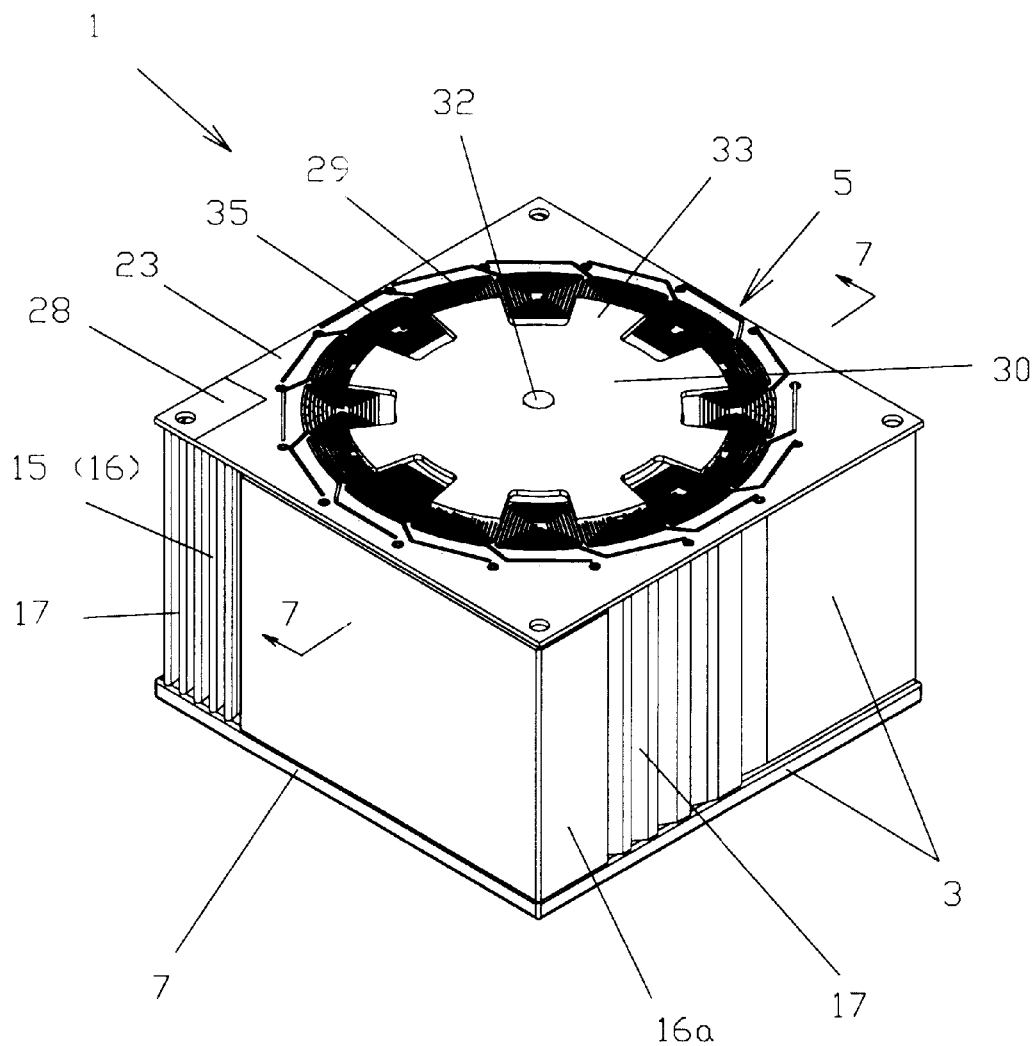
FIG. 4 is a perspective view showing the first embodiment of the present invention with heat exchanging means that further located outside of the drum type impeller with a view at an upper electric motor part with a flat electric motor.
Figure 5:
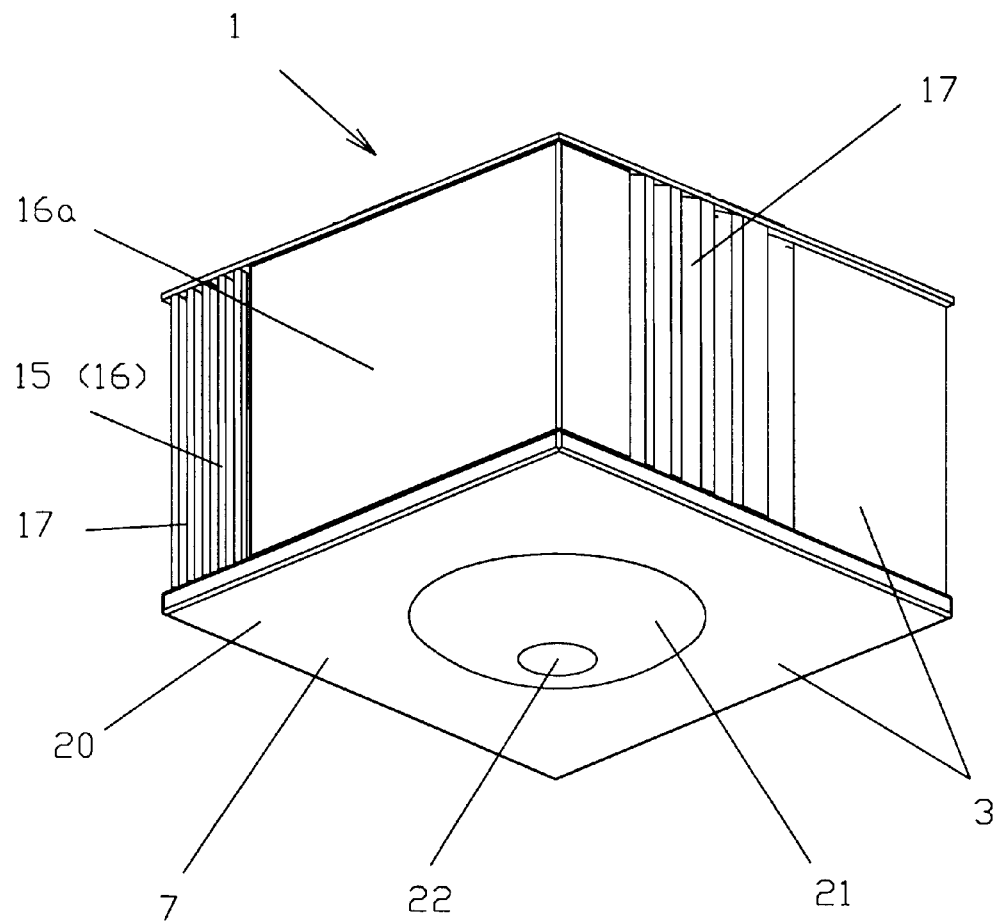
FIG. 5 is a perspective view showing the cooler of the present invention of FIG. 4 with a view at a bottom part of the present invention.

Preferred embodiments of the present invention will be described in detail below with reference to the accompanying drawings. The numbering of components is consistent throughout, with the same components having the same number.

FIGS. 1–12 show the first embodiment of the present invention.

The cooler 1 for an electronic device 2 comprises a heatsink 3, a cross flow blower 4 and an electric motor 5 in combination with the cross flow blower 4 comprises a drum type impeller 6. The electric motor 5 may be conventional type as shown on FIG. 3, but preferable a flat type as, for example, shown on FIGS. 1, 2, 4–9. The heatsink 3 has a base 7 and heat exchanging means 8 located inside of the drum type impeller 6 with an axis of rotation 9 substantially normal to the base 7. The drum type impeller 6 comprises blades 10 and two shrouds 11.

The heat exchanging means 8 are flat disks 12 (FIGS. 2, 7, 10–13) substantially perpendicular to the axis of rotation 9 and thermally connected with the base 7 by at least one heat-spreading means 13 located inside of the drum type impeller 6 and made as guide vanes 14. The guide vanes 14 provide higher blower performance such as airflow and, especially, pressure, and may be made as heat pipes. It is known that heat exchanging means 8—flat disks 12 have high heat exchange efficiency, and the guide vanes 14 provide additional significant surface area for heat dissipation from base 7, therefore provide more uniform cooling of electronic devices 2 (FIG. 7) due to effective cooling of the central part of the base 7.

Figure 6:
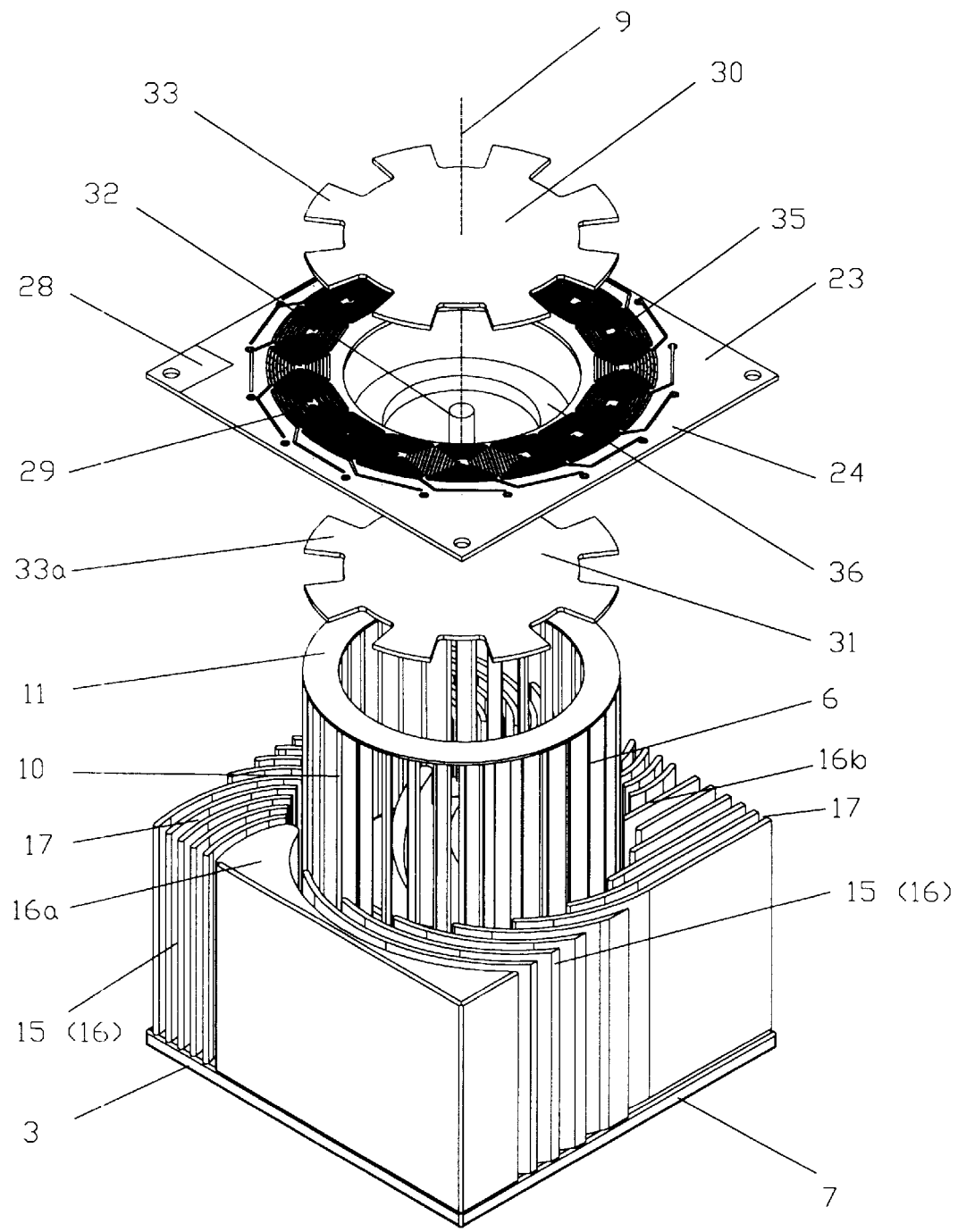
FIG. 6 is an exploded view showing the first embodiment of the present invention shown in FIG. 4.
Figure 7:
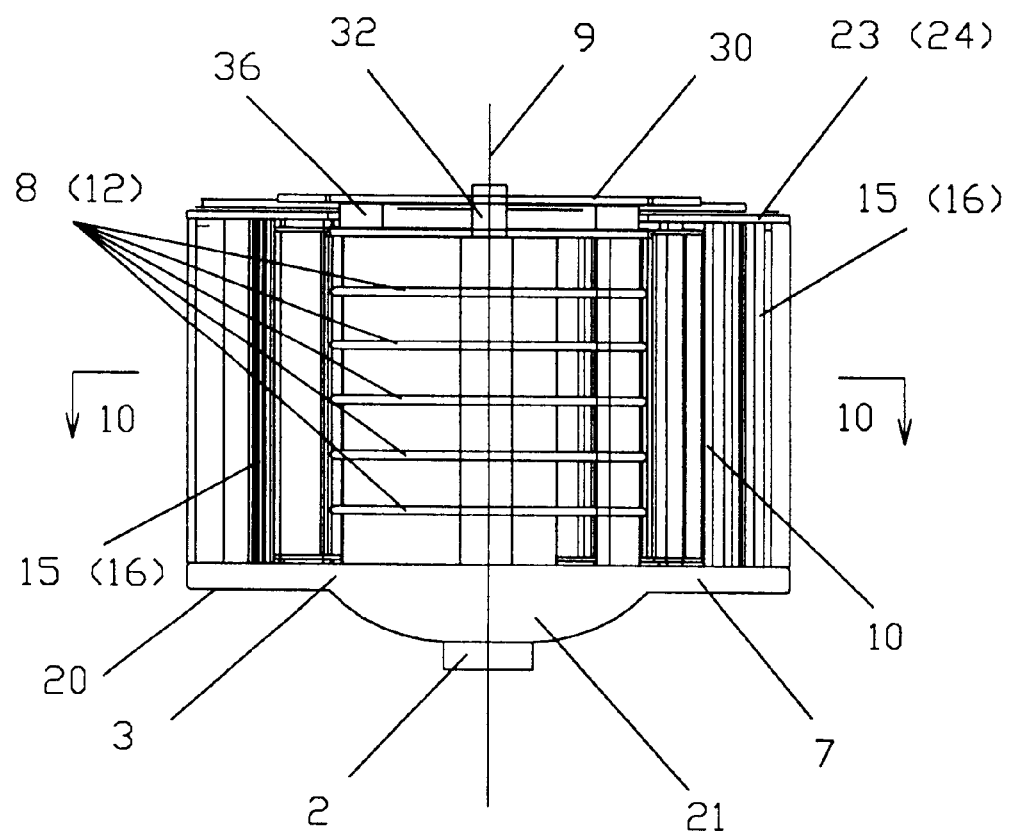
FIG. 7 is a front sectional view of the present invention of FIG. 4 taken along sectional line 7—7.
Figure 8:
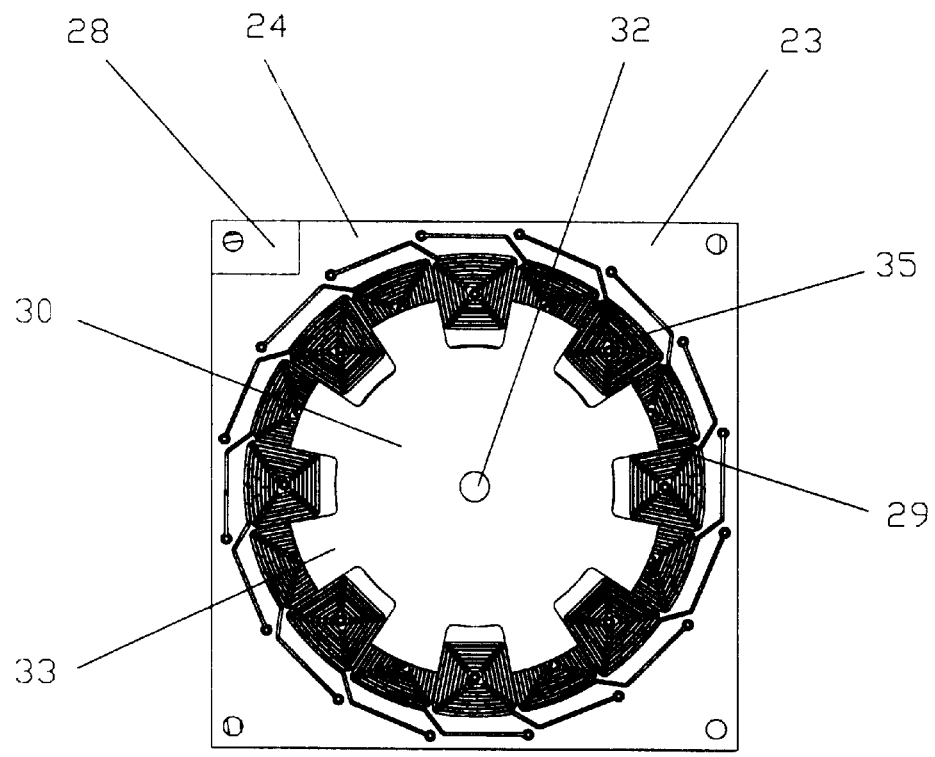
FIG. 8 is a top plan view of a cooler in accordance with the present invention shown in FIG. 4.
Figure 9:
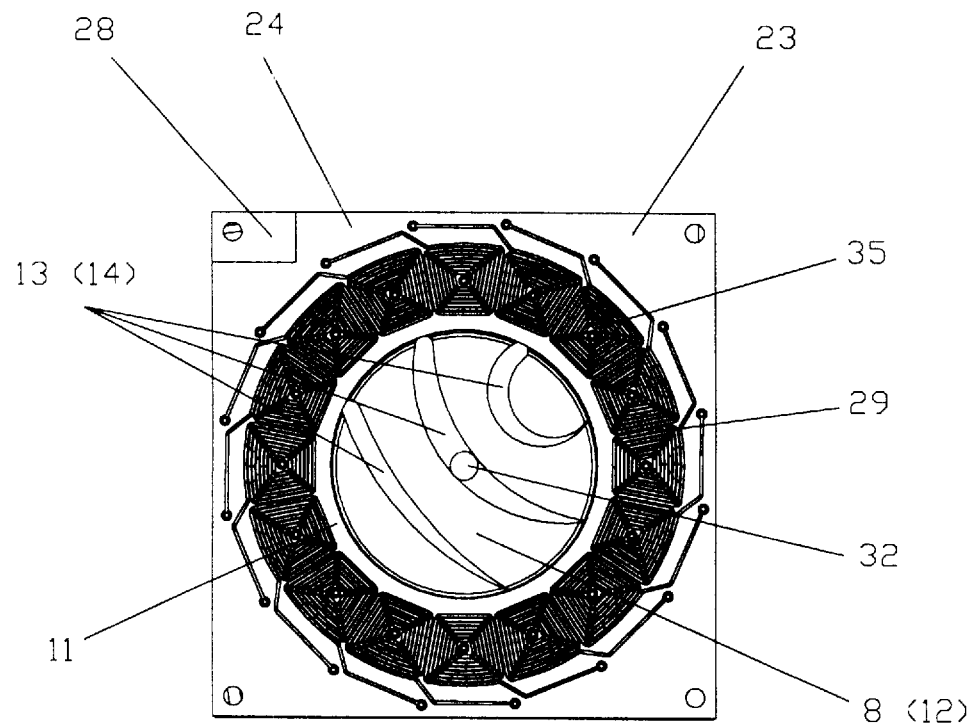
FIG. 9 is the same as FIG. 8 with an electric motor rotor part removed from the cooler.
Figure 10:
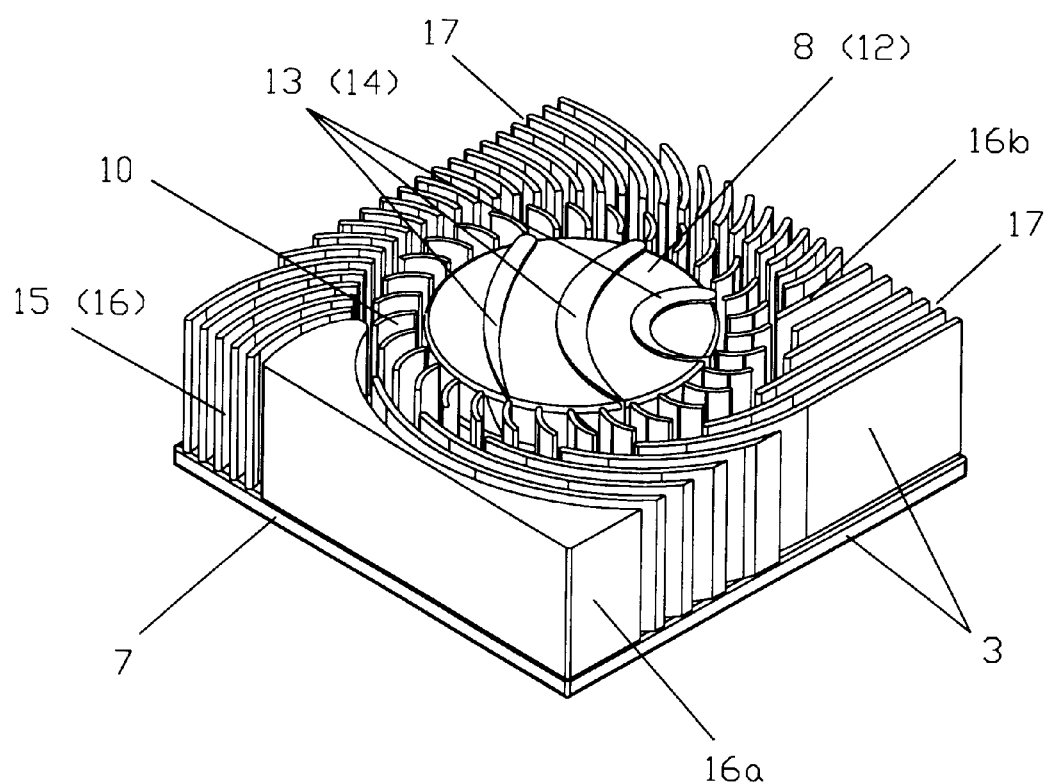
FIG. 10 is a perspective sectional view of the cooler of FIG. 7 taken along sectional line 10—10.
Figure 11:
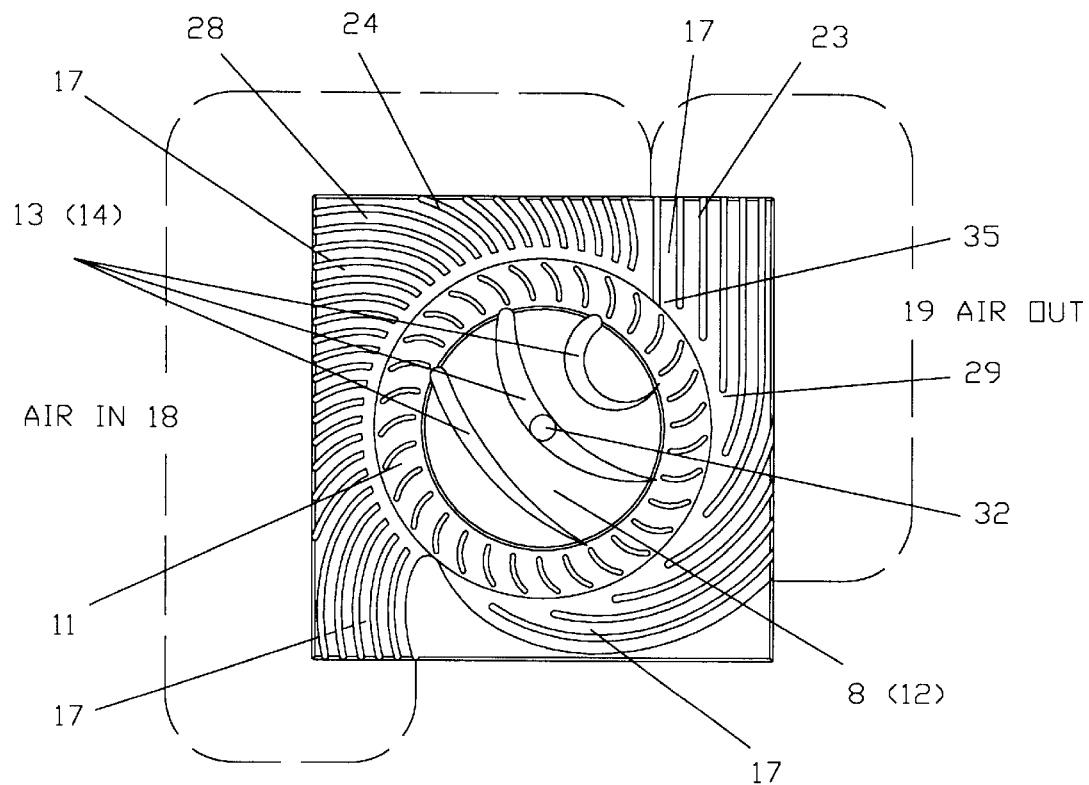
FIG. 11 is a top plan view of the cooler in accordance with the present invention shown in FIG. 10.
Figure 12:
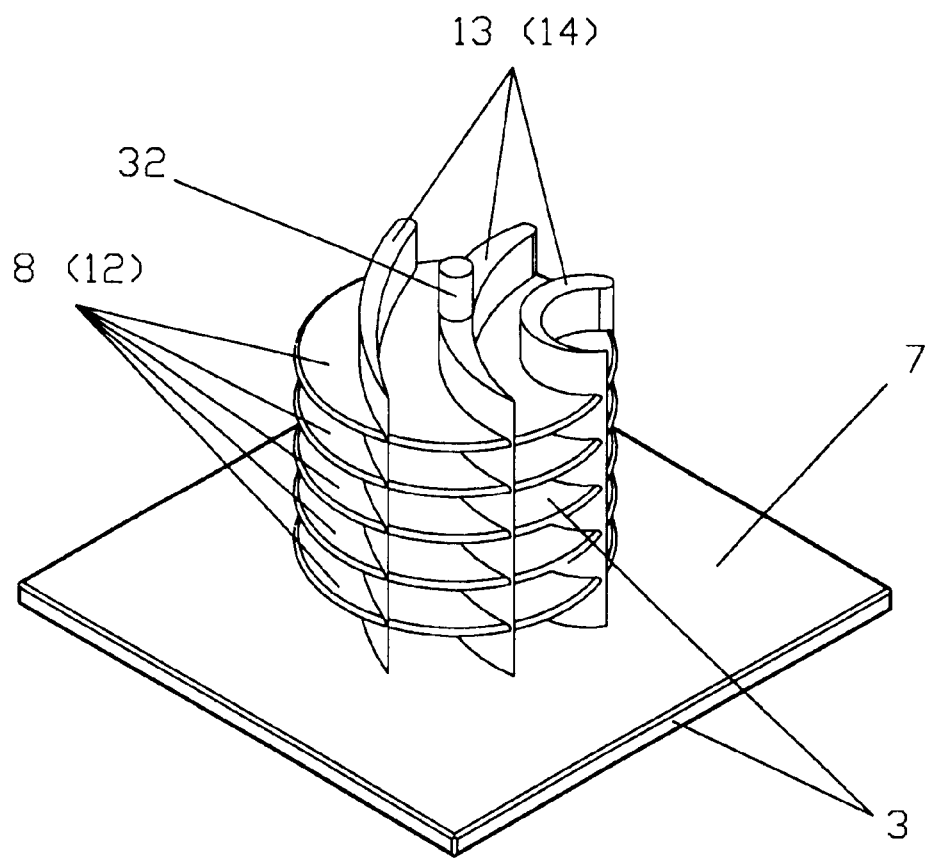
FIG. 12 shown heat exchanging means made as flat disks and heat-spreading means made as guide vanes located inside of the drum type impeller in accordance with the present invention.

The heatsink 3 may further comprise heat exchanging means 15 located outside of the drum type impeller 6 (FIGS. 3–7, 10–11). According to the first embodiment of the present invention the heat exchanging means 15 are fins 16 substantially perpendicular to the base 7, and a plurality of channels 17 are constituted between thereof. These channels 17 may be different width but preferable to have equal width (FIGS. 6, 10 and 11).

Part of the fins 16 is arc shaped and extend radial toward the drum type impeller 6. One of the fins 16a and a wall like fin 16b extend closer to the drum type impeller 6 than other fins 16 and divided the channels 17 to a cross flow blower inlet 18 and cross flow blower outlet 19. The numerous fins 16 provide additional significant increasing of the surface area and, therefore, heat dissipating from heatsink 3.

The base 7 provides thermal contact with the electronic device 2 (FIG. 7) and the heat exchanging means 8 and 15. According to the preferred embodiment of the present invention, a lower surface 20 of the base 7 is attached to the electronic device 2 such as a semiconductor device, for example, a CPU, a microprocessor or a heat pipe. The heatsink 3 is made of a material with high thermal conductivity, for example, aluminum. The lower surface 20 of the base 7 may be made thicker in a central part 21 thereof (see FIGS. 5 and 7). A form of the central part 21 may be different but must have a flat surface 22 for attaching to the electronic devices 2.

The heatsink 3 is covered from upper side with cover plate 23 on which a stator 24 of the electric motor 5 may be made. The cross flow blower 4 is positioned so that the coolant gas, usually air, flows through the fins 16 at the cross flow blower inlet 18, the drum type impeller 6 with located inside the flat disks 12 and the guide vanes 14 and through fins 16 at the cross flow blower outlet 19 in a series way along a plane normal to an axis of rotation 9 of the drum type impeller 6. Back edges 25 of the fins 16 at the cross flow blower inlet 18 are installed so as that air flow approaches to the blades 10 in radial direction, thereby minimizing hydraulic losses at the cross flow blower inlet 18. Accordingly, front edges 26 of the fins 16 at the cross flow blower outlet 19 are installed so as that the direction of air flow after blades 10 is tangential to the surface of the front edges 26, thereby minimizing hydraulic losses at cross flow blower outlet 19.

The electric motor 5 (FIGS. 4, 6, 8 and 9) is a flat type motor and according to the preferred embodiment comprises the stator 24, a magnetic rotor 27 and a motor controller 28. The magnetic rotor 27 is combined with the drum type impeller 6.

The stator 24 is constructed as circuit boards 29 that position on the cover plate 23 and use with the motor controller 28.

The motor controller 28 may be a Full Bridge Drive or a Two Phase-Single Ended Drive, for example of type Fairchild NDSSS58H.

The magnetic rotor 27 comprises two magnetized disks 30 and 31 secured on a shaft 32 having a rotation axis which coincide with the axis of rotation 9 of the drum type impeller 6. Each of the two magnetized disks 30 and 31 has an outer circumferential array of radial extending like magnetized poles 33 and 33a and is mounted perpendicularly to the shaft 32. The magnetized poles 33 of one of said magnetized disks 30 are spaced axially from the magnetized poles 33a of the other of the magnetized disks 31 to form a gap 34. The magnetized poles 33 of one of said magnetized disks 30 are axially aligned with and magnetically opposite to respective magnetized poles 33a of the other of the magnetized disk 31, such that the flux lines of each N magnetized pole 33 of one of the magnetized disk 30 extends to each respective S magnetized pole 33a of the other magnetized disk 31 in the shortest axial flux dimension across the gap 34. The stator 24 comprises a circumferential array of coils 35 on the circuit boards 29, each coil 35 is wound about an axis parallel to the shaft 32 for generating an axially directed electromagnetic field that interacts with said flux lines. The coils 35 are at least partially positioned within the gap 34 during magnetic rotor 27 rotation. A cylindrical magnet 36 is placed between the magnetized disks 30 and 31.

The operation and design of the electric motor 5 in this embodiment is substantially the same as was described in the U.S. patent application Ser. No. 09/621,104 for ELECTRIC DRIVE OPTIONS for the same Assignee, which is hereby incorporated by this reference for all that disclosed therein.

The lower magnetized disk 30 of the magnetic rotor 27 is placed on the upper shroud 11 of the drum type impeller 6 and secured with it. Thus, rotation of the magnetic rotor 27 of the electric motor 5 causes rotation of the drum type impeller 6 and generates the airflow of the coolant air and dissipates heat from heatsink 3 to the ambient.

Figure 13:
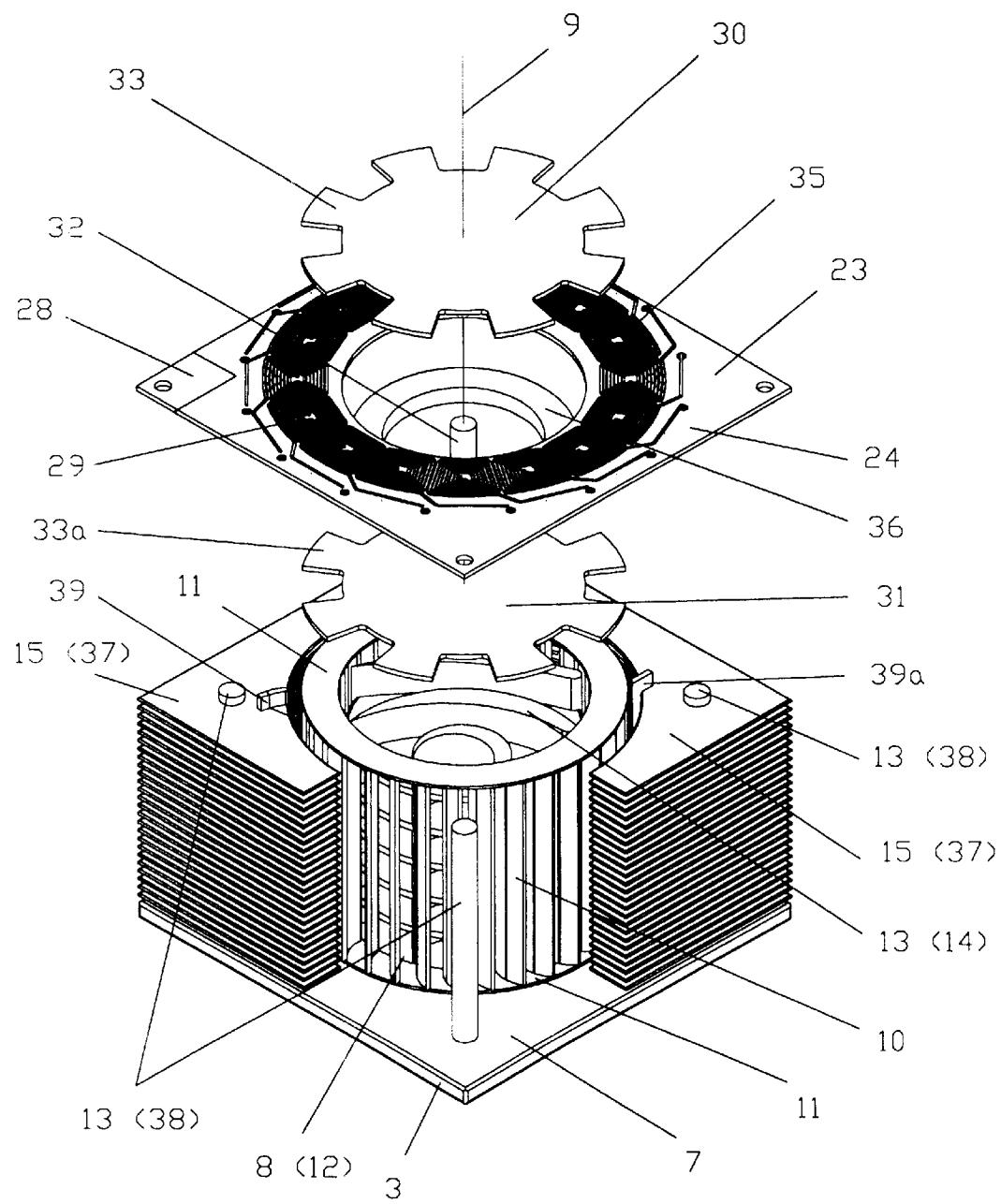
FIG. 13 is an exploded view showing second embodiment of the present invention.

FIG. 13 shows the second embodiment of the present invention. Portions different from those of the cooler for an electronic device of the first embodiment will be described below. In the following description the same elements as those of the cooler of the first embodiment are denoted with the same reference numerals.

The second embodiment of the present invention differs from the first embodiment in that the heat exchanging means 15 located outside of the drum type impeller 6 are flat plates 37 substantially perpendicular to the axis of rotation 9 and thermally connected with the base 7 by several heat-spreading means 13 made as heat-pipes 38 located also outside of the drum type impeller 6. Two dividers 39 and 39a extend closer to the drum type impeller 6 and form a cross flow blower inlet 18 and a cross flow blower outlet 19. According to the second embodiment of the present invention, all the channels 17 are substantially perpendicular to the axis of rotation 9, therefore airflow is characterized as plane-parallel flow and there is no necessity to arrange any flowing correspondence between the channels 17 and the drum type impeller 6.

Hence, the enlarged surface area of the heat exchanging means 8 and 15, and of the heat-spreading means 13 in addition to the uniform airflow along the height of the heatsink 3 for both embodiments, according to the present invention, provide for maximum heat exchange efficiency per unit volume of the cooler for electronic device in comparison with prior art cooling devices.

For both embodiments of the present invention it is possible to use another designs of the electric motor 5 as it were described in the U.S. patent application Ser. No. 10/187,071 for ELECTRIC DRIVE or U.S. Provisional Patent Application No. 60/388230 for INTEGRATED CROSS FLOW TYPE MOTORIZED COOLER FOR COOLING OF ELECTRONIC DEVICES, both for the same Assignee, which is hereby incorporated by this reference for all that disclosed therein.

Each example is provided by way of explanation of the invention, and not as a limitation of the invention. In fact, it will be apparent to those skilled in the art that various modifications and variations may be made in the invention without departing from the scope and spirit of the invention.

As can be seen from the foregoing, the cooler for an electronic device of the present invention is constructed to provide a maximum heat exchange surface at a space limited by the whole cooling device. At the same time all heat exchanging means, both inside and outside of the drum type impeller, are located in full correspondence with airflow streamlines. Therefore, as distinct from prior art cooling devices, the increasing of the heat exchange surface at all other equal conditions is not accompanied by the sufficient increasing of hydraulics losses and, thus it is not caused for decreasing of the airflow.

It is well known, that amount of heat, dissipated by the cooling device to ambient, is proportional, in particular, to the heat exchange surface and heat transfer coefficient that is proportional to the airflow. Therefore, for the best cooling performance a cooling device must have a maximum heat exchange surface at minimum hydraulics losses. The present invention is constructed according to these principles, and provides sufficient increases of the cooling performance in comparison with prior art cooling devices.

What is claimed is:

1. A cooler for an electronic device comprising:
   a heatsink and a cross flow blower with an electric motor, wherein
   (i) said heatsink comprising a base and heat exchanging means;
   (ii) said base provides thermal contact with said electronic device and said heat exchanging means;
   (iii) said cross flow blower comprising drum type impeller with an axis of rotation substantially normal to said base;
   (iv) said heat exchanging means located inside of said drum type impeller.

2. The cooler for an electronic device as claimed in claim 1, wherein said heat exchanging means further located outside of said drum type impeller.

3. The cooler for an electronic device as claimed in claim 1, wherein said heatsink further comprising heat-spreading means that provide thermal contact between said base and said heat exchanging means.

4. The cooler for an electronic device as claimed in claim 2, wherein said heatsink further comprising heat-spreading means that provide thermal contact between said base and said heat exchanging means.

5. The cooler for an electronic device as claimed in claim 1, wherein said heat exchanging means are flat disks substantially perpendicular to the axis of rotation and thermally connected with the base by at least one heat-spreading means located inside of said drum type impeller.

6. The cooler for an electronic device as claimed in claim 5, wherein said heat-spreading means are heat-pipes.

7. The cooler for an electronic device as claimed in claim 5, wherein said at least one heat-spreading means made as a guide vane.

8. The cooler for an electronic device as claimed in claim 2, wherein said heat exchanging means located outside of said drum type impeller are fins substantially perpendicular to the base.

9. The cooler for an electronic device as claimed in claim 2, wherein said heat exchanging means located outside of said drum type impeller are flat plates substantially perpendicular to the axis of rotation and thermally connected with the base by at least one heat-spreading means located also outside of said drum type impeller.

10. The cooler for an electronic device as claimed in claim 9, wherein said heat-spreading means are heat-pipes.

* * * * *